(12) United States Patent
Tan et al.

(10) Patent No.: US 7,288,366 B2
(45) Date of Patent: Oct. 30, 2007

(54) METHOD FOR DUAL DAMASCENE PATTERNING WITH SINGLE EXPOSURE USING TRI-TONE PHASE SHIFT MASK

(75) Inventors: Sia Kim Tan, Singapore (SG); Qun Ying Lin, Singapore (SG); Soon Yoeng Tan, Skudai (MY); Huey Ming Chong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 249 days.

(21) Appl. No.: 10/693,202

(22) Filed: Oct. 24, 2003

(65) Prior Publication Data

US 2005/0089763 A1 Apr. 28, 2005

(51) Int. Cl.
*G03F 9/00* (2006.01)
(52) U.S. Cl. .................. 430/312; 430/5; 430/311; 430/396
(58) Field of Classification Search ............... None
See application file for complete search history.

(56) References Cited

U.S. PATENT DOCUMENTS

| | | | |
|---|---|---|---|
| 5,753,417 A | 5/1998 | Ulrich | |
| 5,906,910 A | 5/1999 | Nguyen et al. | |
| 5,936,707 A * | 8/1999 | Nguyen et al. | 355/18 |
| 6,242,344 B1 | 6/2001 | Koh et al. | |
| 6,355,399 B1 | 3/2002 | Sajan et al. | |
| 6,482,554 B2 | 11/2002 | Matsunuma | |
| 7,014,962 B2 * | 3/2006 | Lin et al. | 430/5 |

* cited by examiner

*Primary Examiner*—Mark F. Huff
*Assistant Examiner*—Daborah Chacko-Davis
(74) *Attorney, Agent, or Firm*—William J. Stoffel

(57) ABSTRACT

A reticle structure and a method of forming a photoresist profile on a substrate using the reticle having a multi-level profile. The reticle comprises (1) a transparent substrate, (2) a partially transmitting 180 degree phase shift film overlying predetermined areas of the transparent substrate to transmit approximately 20 to 70% of incident light, and (3) an opaque film overlying the predetermined areas of the partially transmitting 180 degree phase shift film. The method comprises the following steps: a) depositing a photoresist film over the substrate; b) directing light to the photoresist film through the reticle, and c) developing the photoresist film to form an opening in the resist layer where light only passed thru the substrate, and to remove intermediate thickness of the photoresist film, in the areas where the light passed through the partially transmitting 180 degree phase shift film. In an aspect, the photoresist film is comprised of a lower photoresist layer and an upper photoresist layer. The lower photoresist layer is less sensitive to light than the upper photoresist layer. In an aspect, the resist profile is used to form a dual damascene shaped opening.

9 Claims, 6 Drawing Sheets

METHOD FOR DUAL DAMASCENE PATTERNING WITH SINGLE EXPOSURE USING TRI-TONE PHASE SHIFT MASK

BACKGROUND OF INVENTION

1) Field of the Invention

The present invention relates to a method for manufacturing a semiconductor device and more particularly to a process of formed a resist pattern using a tri-tone partially transmitting phase shift reticle. The present invention relates also to a photolithography mask and more particularly to a tri-tone partially transmitting phase shift reticle used to form dual damascene openings.

2) Description of the Related Art

As the integration of semiconductors is enhanced, the dimensions of devices cannot supply enough area for interconnection. To match the requirements of the metal oxide semiconductor (MOS) devices with smaller dimensions, designs of multilevel interconnections such as dual damascene interconnects, are adapted in most of the integrated circuits (ICs). Normally, an inter-metal dielectric (IMD) layer is used to isolate two conductive layers. In the dual damascene interconnect, a via plug connects adjacent the conductive levels. The trench portion or line connects between points on the same metal level.

There are two conventional methods of fabricating a dual damascene opening having a via and an trench (interconnection). One is to fabricate a via and an interconnection in two steps. That is, a dielectric layer is formed on a metal layer first. Using an etching technique to form a via hole, and a via plug is formed by filling the via hole with conductive material. Another metal layer is formed and defined. An inter-metal dielectric layer is then deposited. Another method is to use damascene technique. A via and an interconnection is formed simultaneously. Two steps to define photo-resist are required in the conventional damascene technique.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,482,554 (Matsunuma) that shows a for a method for a dual damascene pattern comprising: exposing a two photoresist layers.

U.S. Pat. No. 5,906,910 (Nguyen et al.) shows a method for a dual damascene pattern comprising: exposing a photoresist layer using a mask.

U.S. Pat. No. 6,355,399b1 (Sajan et al.) shows a method for a dual damascene pattern comprising: exposing a single photoresist layer using a grey tone mask.

U.S. Pat. No. 6,242,344 (Koh et al.) shows a exposure process for a dual damascene process.

U.S. Pat. No. 5,753,417 (Ulrich) shows a dual damascenes process using multiple exposures of one photoresist layer.

However, these methods can be improved upon.

SUMMARY OF THE INVENTION

The embodiments of the present invention provides a method forming a photoresist pattern having a multi-level profile formed from exposure to light transmitted through a reticle having a multi-level profile, wherein the reticle includes one or more films overlying the reticle substrate to partially transmit and shift the phase of incident light. Other embodiments are reticles structures and methods using the reticle.

An embodiment of the invention is a photolithographic reticle to form a dual damascene profile in a photoresist film. The reticle comprises:

a transparent substrate, said substrate passing all incident light to form the first thickness of photoresist profile, a partially transmitting phase shift film, said partially transmitting phase shift film retarding the phase of incident light approximately 180 degrees and intermediately attenuating incident light to form the second thickness in the photoresist profile;

an opaque film, said opaque blocking all incident light to form the third thickness in the photoresist profile.

An embodiment of a method of forming a photoresist profile can comprise the following. The method of forming a photoresist profile on a substrate uses a reticle having a multi-level profile. The reticle comprises (1) a transparent substrate, (2) a partially transmitting 180 degree phase shift film overlying predetermined areas of the transparent substrate to transmit approximately 20 to 70% of incident light, and (3) an opaque film overlying the predetermined areas of the partially transmitting 180 degree phase shift film. The method comprises the following steps: a) depositing a photoresist film over the substrate; b) directing light to the photoresist film through the reticle, and c) developing the photoresist film to form an opening in the resist layer where light only passed thru the substrate, and to remove intermediate thickness of the photoresist film, in the areas where the light passed through the partially transmitting 180 degree phase shift film.

In an aspect of the embodiment, the photoresist film is comprised of a lower photoresist layer and an upper photoresist layer. The lower photoresist layer is less sensitive to light than the upper photoresist layer. In an aspect, the resist profile is used to form a dual damascene shaped openings.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a reticle according to the present invention and further details of a process of using such reticle in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
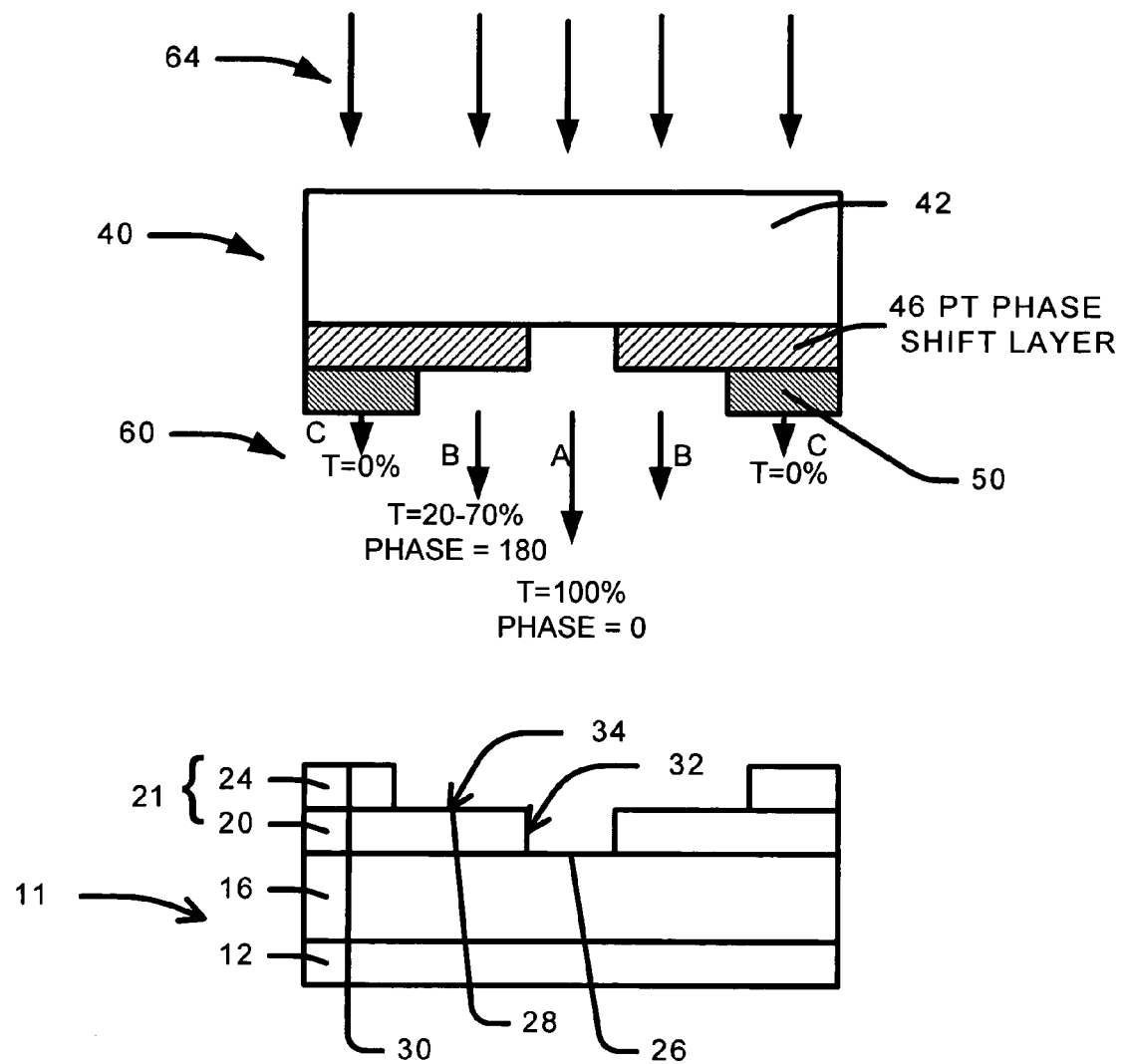
FIG. 1 is a partial cross sectional view a tri-level reticle transmitting incident light at three intensities on a light sensitive surface. Also shown is a embodiment of a two resist layer surface after development showing a dual damascene shaped opening in the resist profile.

I. Method to Form a Tri-Level Photoresist Profile Using a Tri-Tone Phase Shifting Mask A. FIG. 1—Tri-tone Phase Shifting Mask 40

FIG. 1 shows a preferred embodiment of the invention using a tri-tone phase shifting mask 40 to form a tri-level photoresist profile 20 24 over a semiconductor structure 12. The photoresist pattern has a multi-level profile that is formed from exposure to light transmitted through the reticle tri-tone phase shifting mask 40.

FIG. 1 shows a tri-tone phase shifting mask 40 comprised of: the reticle substrate 42 (e.g., a first transmission level film), the partially transmitting (180 degree) phase shift (PTPS) film 46 (e.g., a second transmission level film), and an opaque film 50 (e.g., a third transmission level film).

Reticle Substrate 42

Preferably, the reticle substrate 42 has a 100% transmittance and passes essentially all incident light 64. The substrate 42 is preferably comprised of quartz, synthetic quartz, or glass.

Partially Transmitting Phase Shift (Ptps) Film 46

The partially transmitting phase shift (PTPS) film 46 preferably transmits between approximately 20% to 70% of incident light 64 and shifts the phase 180 degrees in transmission through the partially transmitting film. An important feature of the PTPS film 46 is the 180 degree shift. This 180 degree shift has been found to by the inventors to enable the definition of smaller features.

The second transmission level film 46 attenuates the intensity of transmitted light, a predetermined percentage. Preferably the partially transmitting phase shift (PTPS) film 46 is comprised of indium tin oxide, elemental metal, suitable compounds, such as oxides, silicides, or nitrides of materials, such as molybdenum silicon oxynitride. The partially transmitting phase shift film 46 preferably has a thickness between 30 and 7000 Å. The PTPS film 46 can be comprised of one or more layers.

The partially transmitting phase shift film 46 may be formed from an elemental metal, such as gold, or from suitable compounds, including fluorides, silicides, oxides, or nitrides of materials, such as aluminum, chromium, hafnium, molybdenum, nickel, niobium, tantalum, titanium, tungsten, or zirconium. Examples include chromium fluoride, zirconium silicon oxide, molybdenum silicon oxide, aluminum nitride, or silicon nitride.

Opaque Film 50

The opaque film 50 overlies sections of the partially transmitting film 46. The opaque film blocks essentially all incident light so that all incident light is attenuated. The opaque film is preferably comprised of Cr, CrO, or iron oxide. The opaque film preferably has a thickness between 600 and 1200 Å. The opaque film can be comprised of a material with a large extinction coefficient (k).

Tables 1 and 2 below describe preferred characteristics for the embodiment.

TABLE 1 partially transmitting phase shift Mask of invention

| Layer | phase shift (degrees) | Transmittance |
|---|---|---|
| reticle substrate 42 | 0 | 100% |
| partially transmitting phase shift layer 46 | 180 | 20 to 70% |
| opaque layer 50 | 0 | 0 |

TABLE 2

Light 60 light thru mask at the resist surface

| area | phase shift (degrees) | Transmittance |
|---|---|---|
| A—via (light passes thru substrate 42 only) | 0 | 100 |
| B—trench (light passes thru substrate 42 and partially trans Phase Shift layer 46 | 180 | 20 to 70% |
| C—non-patterned area (opaque layer) | 0 | 0 |

B. Method to Expose Resist Film

As shown in FIG. 1, we expose a light sensitive photoresist film 21 (20 24), having a predetermined thickness, to light 60 transmitted through the reticle 40 for a predetermined amount of time.

The exposure process is preferably performed under a condition in which the wavelength of exposure light is 248 nm and the energy of exposure is between 20 and 60 mJ/sec in this embodiment.

In FIG. 1, the film 20 24 is shown after exposure and development. During the exposure, film 20 24 would be level.

The transmitted light A 60 that is transmitted through the reticle substrate 42 in area A exposes a first photoresist area 26 (via area) to a first dosage.

The light (60) B transmitted through the partially transmitting PS film 46 and the reticle substrate 42 expose a second photoresist area 28 (trench area) to a second, intermediate dosage. Preferably the intermediate dosage is between approximately 20% to 70% of incident light 64. Also, the partially transmitting phase shift (PTPS) film 46 shifts the phase of the light 180 degrees.

The Light C being transmitted through the remaining opaque film 50 exposes a third photoresist area (non-exposed area 30) to a third dosage. The third dosage is preferably about 0.

Next, we develop the photoresist film 20 23 to form a photoresist profile having an opening 32 (e.g. via opening) in the first photoresist area 26 and a trench opening 34 in the See. FIG. 1.

The photoresist profile has the photoresist predetermined thickness in the third photoresist area 30 (non-exposed area or non-patterned area).

The photoresist profile has an intermediate thickness, between the predetermined thickness and zero, in the second photoresist area 28 (trench area). The intermediate thickness in the second photoresist area 28 (e.g., trench area) is preferably between 40 and 60% of the predetermined thickness.

Light introduced to the reticle transmits at least three intensities of light to transform the photoresist substrate into a profile of at least two thicknesses and an opening, generally replicating the multi-level profile of the reticle.

C. Multiple Resist Layers with Different Light Sensitivities

In an embodiment (as shown in FIG. 1) the photoresist film 21 is comprised of a lower photoresist layer 20 and an upper photoresist layer 24.

For positive type photoresist, the lower photoresist layer is less sensitive to light than said upper photoresist layer.

For positive type photoresist, the sensitivity of the lower photoresist layer and the upper photoresist layer is adjusted so that:
- the first intensity of light A through the transparent substrate 42 sensitizes both the lower and upper photoresist layers 20 24;
- the second intensity of light B through the transparent substrate and the partially transmitting phase shift layer 46 sensitizes only the upper photoresist layer 24;
- the third intensity of light through the opaque film does not sensitize either the lower or the upper photoresist layer.

Sensitized means that the resist is exposed to sufficient light to allow the exposed area to be developed.

The lower photoresist layer can be less sensitive to light than said upper photoresist layer by between about 5 and 10%. The amount the upper resist layer is more sensitive to light than the bottom resist layer is measured by the intensity threshold level (e.g., the aerial intensity level) whereby the feature will form in the resist.

Lower Resist Layer 20

The lower photoresist layer 20 preferably is comprised of four components: polymer system, PAG (photo sensitizer), quencher and solvent. The lower resist layer 20 preferably has a thickness between 3000 Å and 5000 Å.

Upper Resist Layer 24

The upper photoresist layer 24 preferably is comprised of a material more sensitive that the lower photoresist layer. The upper resist layer 24 preferably has a thickness between 4000 and 7000 Å.

The sensitivity of the resist can be tuned by varying the concentration of the sensitizer, such as onium salt, diazomethanes and imide sulfonates. To make the resist less sensitive, the concentration can range from 2% to 10%. The same type of resist as the lower resist layer 20 can be used for the upper resist layer 24. However, to make the upper resist more sensitive, the concentration of the sensitizer can be increased in the range between 20% to 50%. compared to the lower resist (less sensitive).

Polymer systems that can be used include copolymer systems comprised of hydroxystyrene and methoacrylate. Suitable sensitizers include diazomethons and Imidesulfonates. The sensitivity of the resist can be change by varying the sensitizer concentration.

As a result of exposure (preferable one step exposure, not multiple exposures) through the photolithography mask 40, the resist region (via region 26) covered by the first transmittance part 42 is exposed with a first intensity A and the resist region (trench region 28) covered by the second transmittance part 46 is exposed with a second intensity B which is smaller than the first intensity. The exposure light C does not reach the resist region (non-patterned area) covered by the light-shielding part 50. In this embodiment, the sensitivity of the first and second photoresist films 20 and 24 and the transmittance of the first and second transmittance parts 42 and 46 are adjusted such that both the first and second photo resist films 20 and 24 are sensitized in the region (via area 26) covered by the first transmittance part 42 and the second photoresist film 24 alone is sensitized in the region (trench region 28) covered by the second transmittance part 46.

Figure 2:
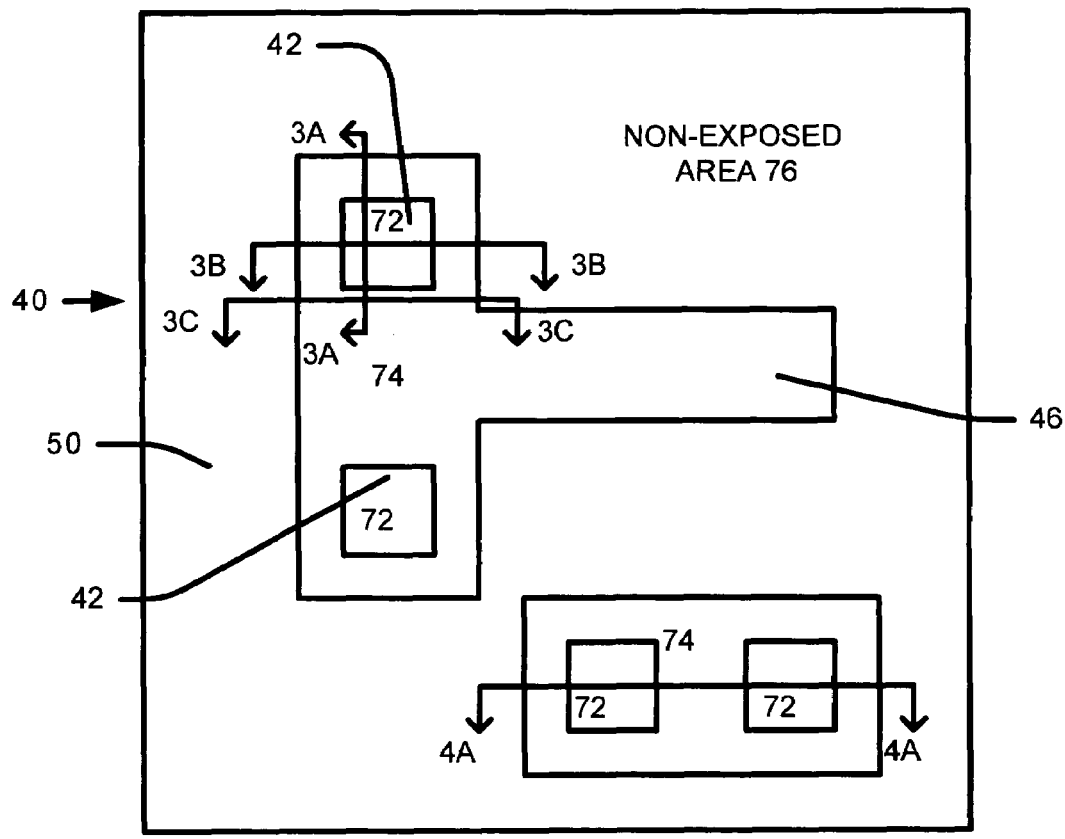
FIG. 2 is a top down view of a portion of the reticle according to an embodiment of the current invention.

D. FIG. 2—Dual Damascene Interconnect

FIG. 2 shows a top down view of the PTPS reticle 40. FIG. 2 shows an example of a pattern for dual damascene interconnect.

FIG. 2 shows the reticle substrate 42 in the via area 72 (or opening in the PTPS layer 46 on the reticle). Also shown is the PTPS layer 46 exposed in the trench area 74 or (in the opening in the opaque layer 50 on the reticle). Also shown is the opaque layer 50 in the opaque or non-patterned region 76.

Figure 3A:
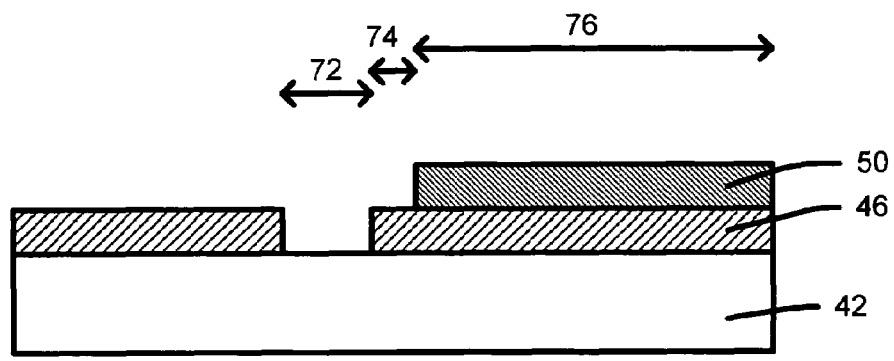
FIG. 3A is a cross sectional view of the reticle taken along the axis 3A in FIG. 2 according to an embodiment of the current invention.

FIG. 3A is a cross sectional view of the reticle is taken along the axis 3A in FIG. 2.

Figure 3B:
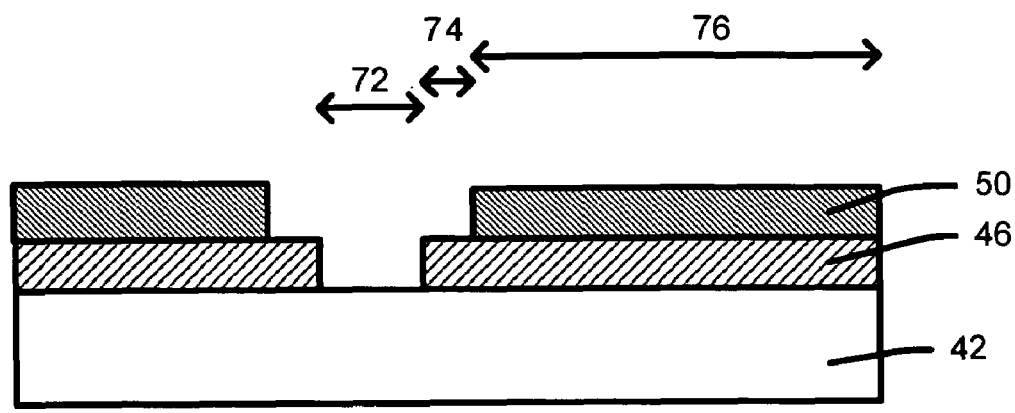
FIG. 3B is a cross sectional view of the reticle taken along the axis 3B in FIG. 2 according to an embodiment of the current invention.

FIG. 3B is a cross sectional view of the reticle taken along the axis 3B in FIG. 2.

Figure 3C:
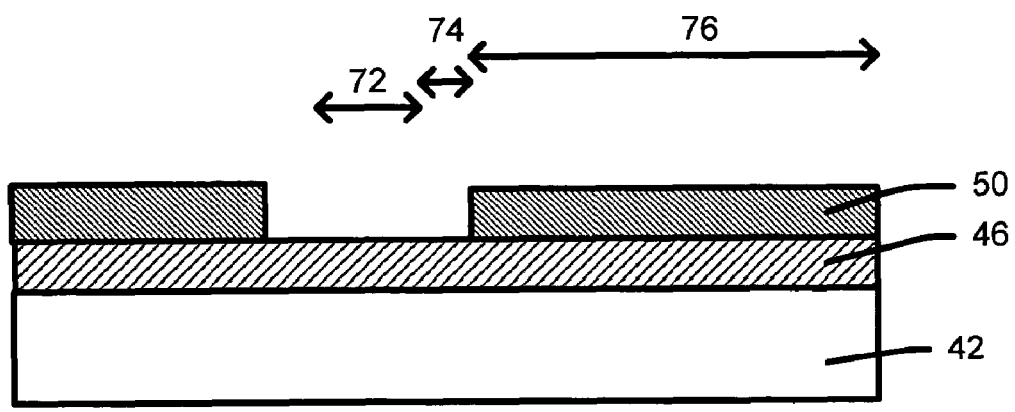
FIG. 3C is a cross sectional view of the reticle taken along the axis 3C in FIG. 2 according to an embodiment of the current invention.

FIG. 3C is a cross sectional view of the reticle taken along the axis 3C in FIG. 2.

E. FIG. 4A

Figure 4A:
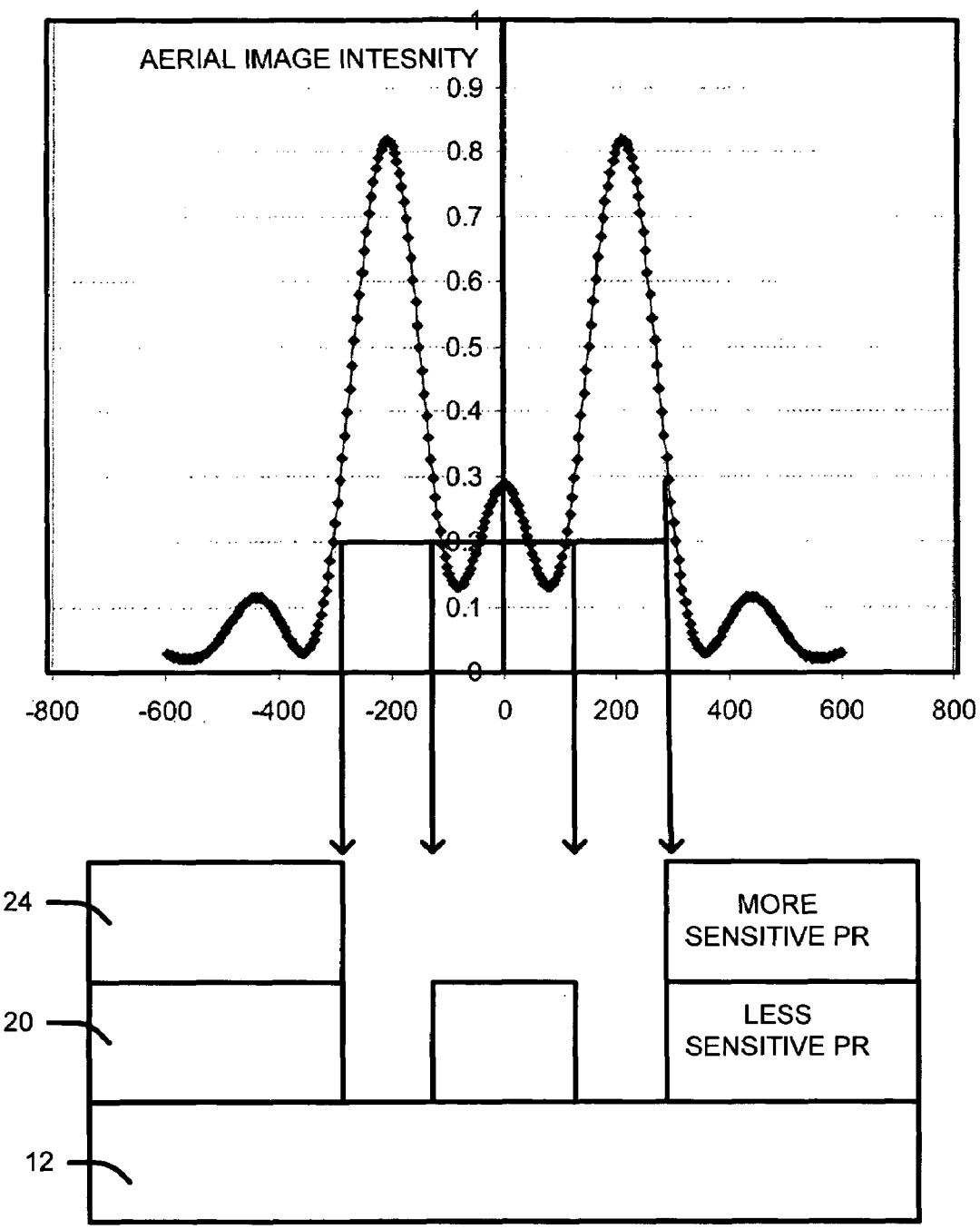
FIG. 4A shows an aerial image intensity plot for light transmitted thru the reticle thru axis 4A shown in FIG. 2 according to an embodiment of the current invention.

FIG. 4A shows an aerial image intensity plot for light transmitted thru the reticle thru axis 4A shown in FIG. 2. Also shown is the resist profile after exposure and development. Intensity simulation using 248 nm wavelength, Numerical Aperture (Na) of 0 f and partial coherency factor (σ) (sigma) of 0.5 was used to form the desired intensity profile. The use of the phase shifting layer 46 with the 180 degree shift produced small via holes. The area surrounding the hole will have low intensity, but as the area is relative small, the resist process of baking will eliminate the feature. The topographical resist profile shows a via hole and trench line in which metal can be formed (in the subsequently patterned dielectric layer).

II. Single Step Etch Process to Form Dual Damascene Opening in Dielectric Layer

Figure 5A:
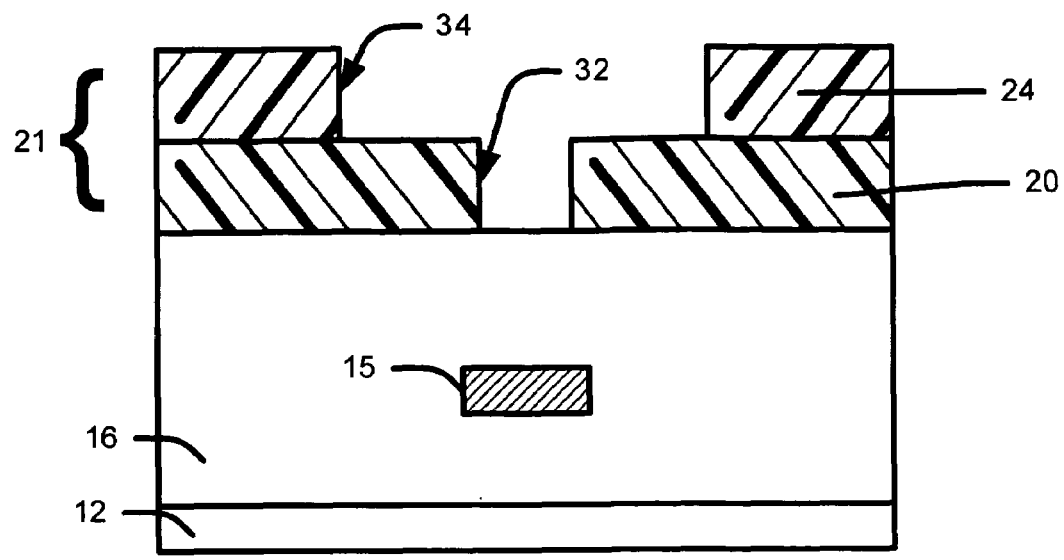
FIGS. 5A, 5B and 5C illustrate an embodiment of single step etch process of the invention to form dual damascene opening in dielectric layer.
Figure 5B:
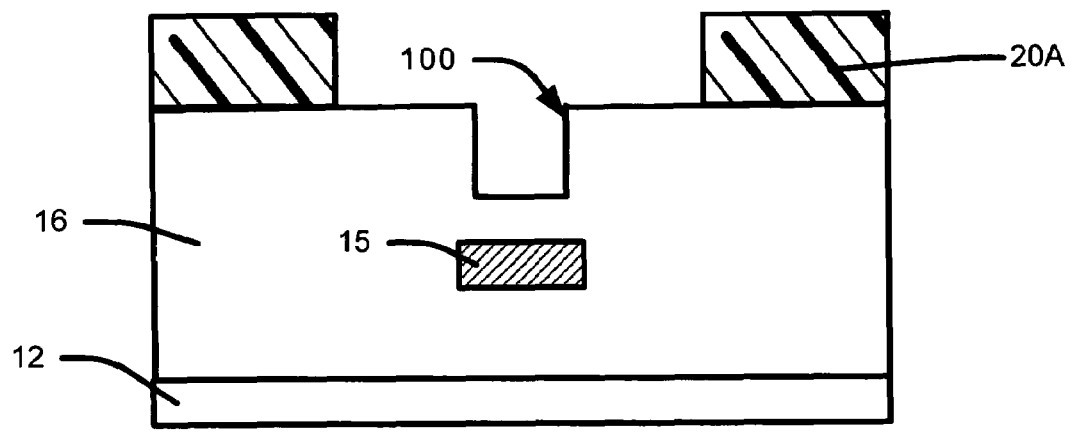
Figure 5C:
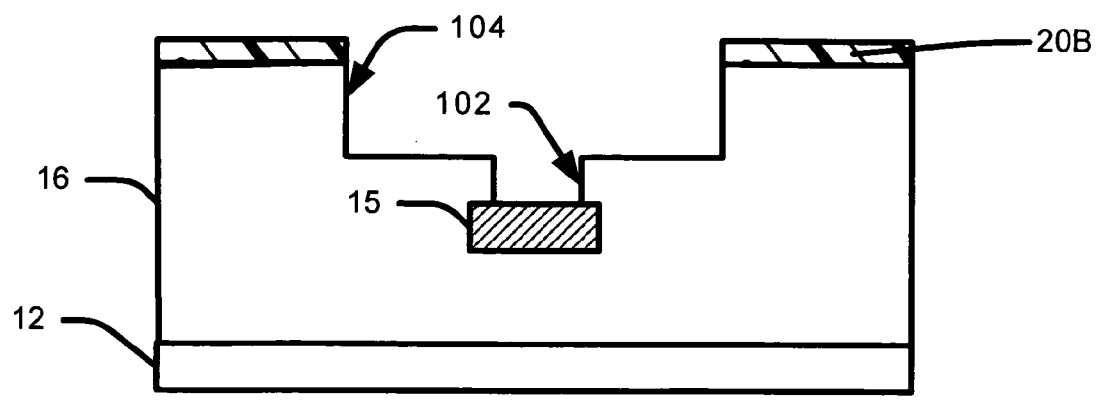

FIGS. 5A, 5B and 5C illustrate an embodiment of Single step etch process to form dual damascene opening in dielectric layer.

FIG. 5A is cross sectional view of a semiconductor structure 12 having a dielectric layer 16 and conductive line 15 thereover. The dielectric layer is preferably an inter dielectric layer and can be comprised of a dielectric material such as oxide or a low k material.

The bi-resist film 20 24 of the embodiment is formed over the dielectric layer 16 preferably using a spin on process. The resist layers 20 24 are exposed as using the processes describe above using the embodiment's tri-tone phase shift mask 40.

The resist layers are developed to pattern and create the tri level resist profile shown in FIG. 5A. For development, the exposed resist can be continuously sprayed with slow rotation between 100 and 500 RPM puddle development. The developed can be TMAH with or without a surfactant with a concentration of about 2.38% (+/−10%). The developer is rinsed off with DI water and spun dry. Next the wafer is warm air baked.

As shown in FIGS. 5B and 5C, a single step etch process is used to etch the resist layers 20 24 and the dielectric layer 16 to form a dual damascene shaped opening the in dielectric layer 16.

FIG. 5B shows a point along the etch process where the upper resist layer 24 is removed and the lower resist layer not initially covered by the upper resist layer 24 is removed. The etch forms a partial via opening 100 in the dielectric layer.

FIG. 5C shows the end of the etch where most of the lower resist layer 20B is removed (a optional portion of resist 20B is shown remaining). The via opening 102 and trench opening 104 are formed in the dielectric layer.

An feature of this embodiment is that the 2 resist layers 24 20 and the dielectric layer 16 have about the same etch rate. This allows the tri level resist pattern to be transferred to the underlying dielectric film. If the etch rates differ, the thickness of the resists can be tuned.

Figure 5D:
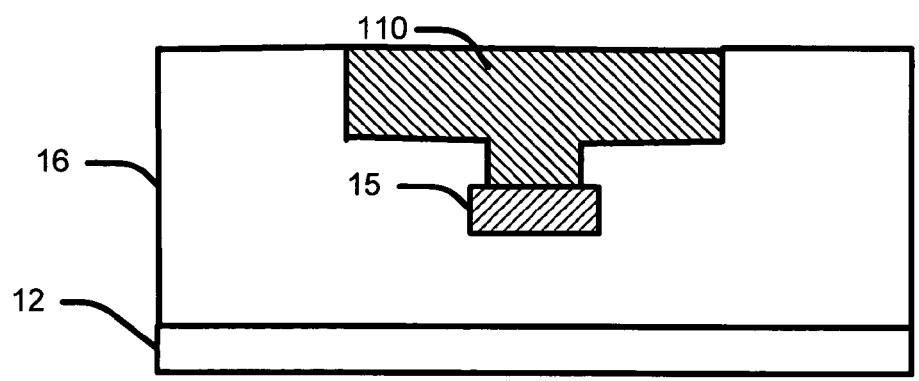
FIG. 5D is a cross sectional view of a dual damascene interconnect formed in the opening in the dielectric layer according to an embodiment of the invention.

FIG. 5D shows a dual damascene interconnect 110 formed in the damascene opening 102 104. The interconnect is preferably comprised of Cu and planarized using a chemical-mechanical polish (CMP) process.

III. Aspects of the Invention

The embodiments of the invention provide the following features:

1) tri tone partially transmitting 180 degree phase shift mask (see FIG. 1).

2) two resist layers (see FIG. 1, layers 20 24)—top resist layer 24 more sensitive to light. This improves the pattern using the invention's PTPS mask.

3) (See FIGS. 5A-5C) single step etch of resist and dielectric layer to form dual damascene opening in dielectric layer.

An important feature of the PTPS film 46 is the 180 degree shift. The PTPS film's 180 degree shift has been found to by the inventors to enable the definition of smaller features. Also, there is a synergy of using the mask with the PTPS film's 180 degree shift and the two level photoresist with 2 different light sensitivities. This combination enables enhanced feature resolution (e.g., formation of a smaller via hole in a dual damascene process).

Moreover the resulting multi-level resist profile allows for a single step etch to define a dual damascene pattern in a underlying dielectric layer. The single etch step saves time and costs.

The above advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence.

The embodiments of the invention can be used to form a four or more tone phase shift mask with 2 partially transmitting layers with difference transmittance to form a four level resist profile. (e.g., 2 different level trench resist levels). In addition, a third layer resist film could be used with 3 different resist light sensitivities. Other embodiments of the invention can use masks with additional tones and/or additional resist layers and resultant resist profile.

In the above description numerous specific details are set forth in order to provide a more thorough understanding of the present invention. It will be obvious, however, to one skilled in the art that the present invention may be practiced without these details. In other instances, well known process have not been described in detail in order to not unnecessarily obscure the present invention.

Although this invention has been described relative to specific insulating materials, conductive materials and apparatuses for depositing and etching these materials, it is not limited to the specific materials or apparatuses but only to their specific characteristics, and capabilities, such as depositing and etching, and other materials and apparatus can be substituted as is well understood by those skilled in the microelectronics arts after appreciating the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for forming a photoresist pattern on a prescribed film, said photoresist pattern having a multi-level profile formed from exposure to light transmitted through a reticle having a multi-level profile, the method comprising the steps of:

a) providing a reticle; the reticle comprises one or more films overlying a reticle substrate to partially transmit and shift the phase of incident light, said reticle is comprised of the reticle substrate, a partially transmitting phase shift film, and an opaque film;

the reticle substrate passing essentially all incident light, and the partially transmitting phase shift film transmitting approximately between 20% to 70% of incident light and shifting the phase about 180 degrees in transmission through the partially transmitting phase shift film, and the opaque film overlying sections of the partially transmitting phase shift film, the opaque film blocking light so that essentially all incident light is attenuated;

b) exposing a light sensitive photoresist film, having a predetermined thickness, to light transmitted through the reticle for a predetermined amount of time, with light being transmitted through the reticle substrate exposing a first photoresist area of said light sensitive photoresist film to a first dosage, with light being transmitted through the partially transmitting phase shift film exposing a second photoresist area of said light sensitive photoresist film to a second intermediate dosage, and with light being transmitted through the opaque film exposing a third photoresist area of said light sensitive photoresist film to a third dosage;

said light sensitive photoresist film is comprised of a lower photoresist layer and an upper photoresist layer; said lower photoresist layer is less or more sensitive to light than said upper photoresist layer; and c) developing the light sensitive photoresist film exposed in step (b) to form a photoresist profile having an opening in the first photoresist area, the photoresist profile having the predetermined thickness in the third photoresist area, and the photoresist profile having an intermediate thickness, between the predetermined thickness and zero, in the second photoresist area.

2. The method of claim 1 wherein said lower photoresist layer is less sensitive to light than said upper photoresist layer by between about 5 and 10%.

3. The method of claim 1 wherein: said lower photoresist layer is less sensitive to light than said upper photoresist layer in a case where the upper and lower photoresist layers are positive type; or said lower photoresist layer is more sensitive to light than said upper photoresist layer in a case where the upper and lower photoresist layers are negative type.

4. The method of claim 1, which further includes: etching in a single step, said light sensitive photoresist film and a dielectric layer under said light sensitive photoresist film to form a dual damascene shaped opening in said dielectric layer; and said light sensitive photoresist film and said dielectric layer have about the same etch rate.

5. The method of claim 1 which further includes:

etching in a single step, said light sensitive photoresist film and a dielectric layer under said light sensitive photoresist film to form a dual damascene shaped opening in said dielectric layer; and said lower photoresist layer, said upper photoresist layer and said dielectric layer have about the same etch rate.

6. A method of forming a photoresist film profile over a substrate using a reticle, the method comprising the following steps:

providing a reticle; said reticle comprising, (1) a transparent substrate, (2) a partially transmitting 180 degree phase shift film overlying predetermined areas of the transparent substrate to transmit approximately 20 to 70% of incident light, and (3) an opaque film overlying predetermined areas of the partially transmitting 180 degree phase shift film;

depositing a photoresist film having a predetermined thickness over a dielectric layer over a substrate; said photoresist film is comprised of a lower photoresist layer and an upper photoresist layer; said lower photoresist layer is less sensitive to light than said upper photoresist layer;

in a one step exposure, directing light to the photoresist film through the reticle, the reticle transmitting a first intensity of light through the transparent substrate to create a first exposure pattern, the reticle transmitting a second intensity, less than the first intensity, of light through the partially transmitting 180 degree phase shift film to create a second exposure pattern, and the reticle transmitting a third intensity of light, blocking about all incident light, through the opaque film to create a third exposure pattern; and developing the photoresist film to remove a first thickness of photoresist film, approximately equal to the predetermined thickness, in areas of the first exposure pattern, and to remove a second, intermediate thickness of the photoresist film, less than the first thickness, in the areas of the second exposure pattern, whereby a photoresist profile includes areas of the photoresist film having a plurality of different thicknesses.

7. The method of claim 6 wherein the sensitivities of the lower photoresist layer and the upper photoresist layer are adjusted so that:

the first intensity of light through the transparent substrate sensitizes both the lower and upper photoresist layers; and the second intensity of light through the transparent substrate sensitizes only the upper photoresist layer; and the third intensity of light through the opaque film does not sensitize the lower or the upper photoresist layer.

8. The method of claim 6 wherein said lower photoresist layer is less sensitive to light than said upper photoresist layer by between about 5 and 10%.

9. The method of claim 6 which further includes:

said lower photoresist layer is less sensitive to light than said upper photoresist layer by between about 5 and 10%; and transferring said first and second exposure patterns in said photoresist film by an etch into said dielectric layer in a single etch step; the etch rate of said photoresist film and said dielectric layer are about equal.

* * * * *